(12) United States Patent
Cigada et al.

(10) Patent No.: US 7,075,172 B2
(45) Date of Patent: Jul. 11, 2006

(54) LEAD-FRAME FOR SEMICONDUCTOR DEVICES

(75) Inventors: Andrea Giovanni Cigada, Brugherio (IT); Phui Phoong Chuang, Kuala Lampur (MY)

(73) Assignees: STMicroelectronics S.r.l., Agrate Brianza (IT); STMicroelectronics SDN, BHD, Johore (MY)

( * ) Notice: Subject to any disclaimer, the term of this patent is extended or adjusted under 35 U.S.C. 154(b) by 625 days.

(21) Appl. No.: 09/917,406

(22) Filed: Jul. 26, 2001

(65) Prior Publication Data

US 2002/0033523 A1   Mar. 21, 2002

(30) Foreign Application Priority Data

Jul. 27, 2000   (IT)   ................... MI2000A1719

(51) Int. Cl.
*H01L 23/495* (2006.01)

(52) U.S. Cl. ............... 257/666; 257/678; 438/123; 438/124

(58) Field of Classification Search ............ 257/99, 257/666–676, 787, 678; 438/123, 124
See application file for complete search history.

(56) References Cited

U.S. PATENT DOCUMENTS

| | | | | |
|---|---|---|---|---|
| 4,777,520 A | * | 10/1988 | Nambu et al. | 257/667 |
| 4,894,704 A | * | 1/1990 | Endo | 257/667 |
| 5,275,546 A | * | 1/1994 | Fierkens | 425/116 |
| 5,486,722 A | * | 1/1996 | Sato et al. | 257/666 |
| 5,635,220 A | * | 6/1997 | Izumi et al. | 425/116 |
| 5,665,296 A | * | 9/1997 | Jain et al. | 264/272 |
| 5,914,531 A | * | 6/1999 | Tsunoda et al. | 257/668 |
| 5,959,349 A | * | 9/1999 | Wensel | 257/666 |
| 6,106,259 A | * | 8/2000 | Lee et al. | 425/116 |
| 6,312,976 B1 | * | 11/2001 | Lin et al. | 438/123 |
| 6,319,450 B1 | * | 11/2001 | Chua et al. | 257/787 |
| 6,355,985 B1 | * | 3/2002 | Brand | 257/790 |
| 6,469,369 B1 | * | 10/2002 | Lee | 257/670 |
| 6,558,980 B1 | * | 5/2003 | Miyaki et al. | 438/112 |
| 2001/0013649 A1 | * | 8/2001 | Wensel | 257/666 |
| 2002/0050654 A1 | * | 5/2002 | Bolken | 257/787 |
| 2003/0100141 A1 | * | 5/2003 | Street et al. | 438/108 |

FOREIGN PATENT DOCUMENTS

JP              05-198707      *   8/1993   ................. 23/30

* cited by examiner

*Primary Examiner*—Douglas W Owens
(74) *Attorney, Agent, or Firm*—Lisa K. Jorgenson; Robert Iannucci; Seed IP Law Group PLLC

(57) ABSTRACT

A lead-frame for semiconductor devices having a mold with at least one air vent for the resin to seep out of during its injecting into the mold, the air vent being positioned between the upper and lower surface of the frame, wherein the frame provides a through hole positioned at the outlet of the air vent so that, when the resin has solidified, it forms a flash which is in coherence with the surface of the frame.

28 Claims, 3 Drawing Sheets

LEAD-FRAME FOR SEMICONDUCTOR DEVICES

BACKGROUND OF THE INVENTION

1. Technical Field

The present invention refers to a lead-frame for semiconductor devices, particularly during the encapsulation operation of the devices.

2. Description of the Related Art

During the molding process of a semiconductor device or an integrated circuit, this is welded to a metal structure or frame called "lead-frame," and has fine blades usually made of copper, or other conductive material for the electric connection.

During a successive phase a mold, the so-called "package," is closed around the integrated circuit by the upper and lower surfaces of the lead-frame and the mold is filled, by injecting means, with some plastic or resinous material, so as to make the body of the integrated circuit package, after the resin has solidified.

The mold has "air vents," so that it can be completely filled with the plastic material in such a way that air bubbles are prevented from forming inside the plastic material which would prevent the mold from being completely filled.

The air vents are designed to let out the air present in the mold to avoid residuals or flashes, nevertheless the presence of these air vents permits small quantities of resinous material to seep out on the lead-frame external to the mold, resin which forms the so-called "flashes."

The flashes of resinous material are very fragile, possess a weak cohesion with the surface of the lead-frame, and therefore can be easily removed from the lead-frame itself.

The detachment of the flashes from the lead-frame causes a series of problems, for example, that the resin which has become detached can go onto the sensors of the machinery used in phases successive to the molding, causing undesired halting of the machinery itself with evident degradation of performance and production losses.

Another very important problem occurs during the phase of separation of the integrated circuits from the lead-frame. In fact because of this operation the flashes, which fall and adhere to the terminals (the so-called leads) of the lead-frame, can be treated as contaminating elements and thus entail negative results to the electric tests and also refusal of material by the client.

SUMMARY OF THE INVENTION

In view of the state of the technique described, this invention provides increased adhesion of the flash to the surface of the lead-frame and diminishes the amount of contaminating material on the leads.

One embodiment of this invention provides a lead-frame for semiconductor devices, including a frame and a mold having at least one air vent to let out the resin during the injecting in the mold, the air vent being placed between the upper and lower surface of the frame, the mold forming a package of the integrated circuit, wherein the frame provides for a recess or a through hole placed at the outlet of the air vent so that, when the resin has solidified, it forms a flash which is coherent with the surface of the frame.

The invention thus provides a lead-frame which is capable of preventing loss in production and the formation of contaminating material on the leads.

BRIEF DESCRIPTION OF THE DRAWINGS

The characteristics and the advantages of this invention will be evident from the following detailed description of an embodiment thereof, illustrated as non-limiting example in the enclosed drawings, in which.

DETAILED DESCRIPTION OF THE INVENTION

Figure 1:
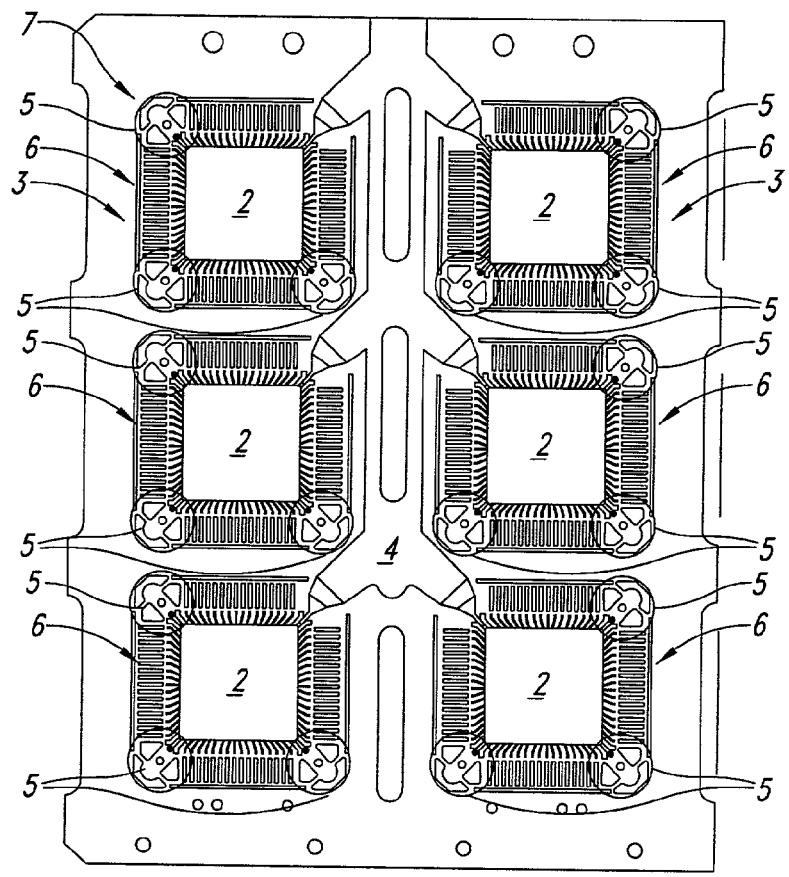
FIG. 1 shows schematically a first embodiment of this invention.

FIG. 1 shows schematically a first embodiment of this invention and according to what is illustrated in the figure a structure 1 called lead-frame can be noted which acts as metal skeleton for a plurality of semiconductor devices (the so-called chips or integrated circuits) 2 which result as being connected to the lead-frame 1 by means of a series of blades or strips of conductive material 3, for example copper. The array of the chips 2 and the contacts 3 makes what is commonly known as "package" 6.

A structure 4 which contacts the plurality of chips 2 can also be noted which has the function of injecting plastic material, for example resin, into all the packages 6.

In a successive phase of the working process, more precisely during the molding phase, also known as "molding," in order that the mold 15 (shown in the FIG. 2) is well filled by the resin injected by the injectors 4, the mold has an air vent, thus forming plastic burrs or flashes.

The flashes that are created because of the air vents are very fragile. The diameter of the air vents is approximately 20 μm and they generate flashes approximately 20–25 μm thick, which, having a weak cohesion with the surface of the lead-frame 1, can be easily removed from the lead-frame 1 itself.

The air vents are positioned in a peripheral zone 5 of the package 6, and are theoretically designed so that during the operation of separating the chips 2 from the lead-frame 1, the flashes, produced by the air vents 9 and subject to breakage, do not cause any quality problems.

The air vent is positioned between an upper and a lower surface of the frame.

Figure 2:
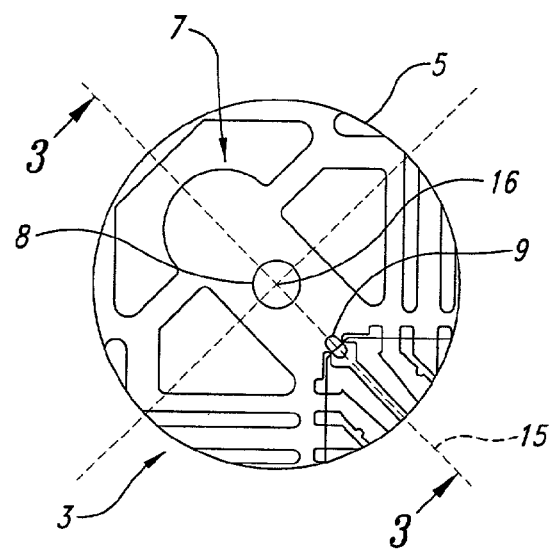
FIG. 2 shows a detail of FIG. 1.
Figure 4:
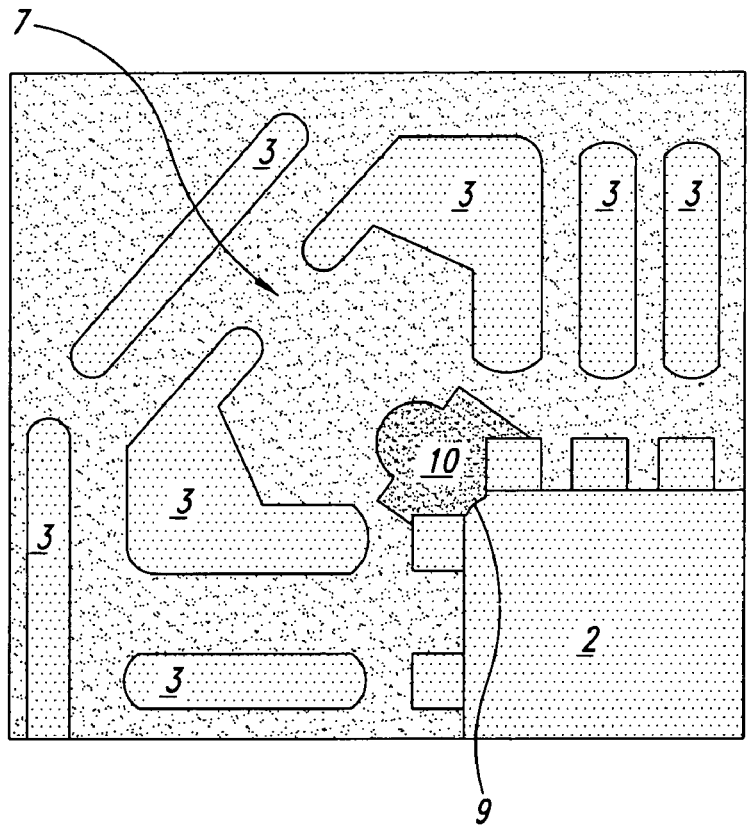
FIG. 4 shows the detail of FIG. 2 after a molding phase.

In reality, the flashes that are formed in a zone 7, called air vent surface, as is shown successively in FIG. 2 and FIG. 4, and their successive detachment cause a series of problems, such as undesired halts of the machinery used in the successive working phase, with production losses.

To obviate this, as is shown in FIG. 2, in zone 7 the applicant found it advantageous to make a circular recess or through hole 8 with its center placed on an outer surface of the lead-frame 1 on the axis of the air vent 9 at a distance from the air vent 9 exceeding 1 mm, so as to increase the local adhesion of the flashes to the surface of the lead-frame 1.

A mechanical means is created, that is the hole or recess 8, for anchoring the resin to the lead-frame 1.

Also in FIG. 2 it can be noted that, in addition to hole 8, there is the air vent 9 from which the resin injected by injector 4 seeps, and in addition the blades 3 which contact the chip 2 with the lead-frame 1 can also be noted.

The hole or recess 8 has a section, which at the most is equal in dimension to that of the air vents 9.

The hole has a circular section with its center positioned on the axis of said air vent and has the dimension of its diameter equal to or shorter than that of said air vent.

Figure 3:
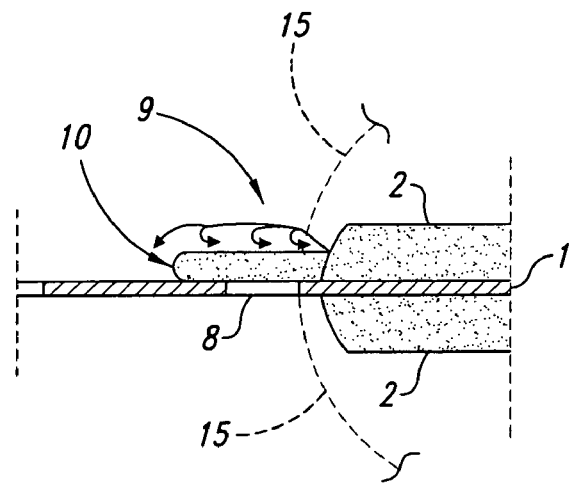
FIG. 3 shows a section of FIG. 2 along the line III—III.

In FIG. 3 a section of FIG. 2 along the line III—III is shown and it can be noted that the resin 10 seeping from air vent 9 moving in the direction of the arrows, fills hole 8. The thickness of package 2 is approximately 0.7 mm. Once resin 10 is solidified it remains in greater cohesion with the surface of the lead-frame 1 as the appendix of resin 10 that has flowed into hole 8 creates a kind of appendix such that it increases adhesion, as shown successively in FIG. 4, during all the successive molding operations.

The air vent 9, by means of the hole 8 of circular section, gives rise to a flash only on the upper surface of the frame 1, the flash having a thickness ranging between 20–25 μm.

In FIG. 4 the air vent surface zone 7 is shown after the operation of molding has been carried out and in particular the electric connection blades 3 can be noted, flash 10 after the molding operation, that is when the residual (or burr) has solidified.

Flash 10 is firmly anchored to lead-frame 1 and this first embodiment of this invention guarantees a significant drop in production losses and a disappearance of contaminating material from the leads.

Figure 5:
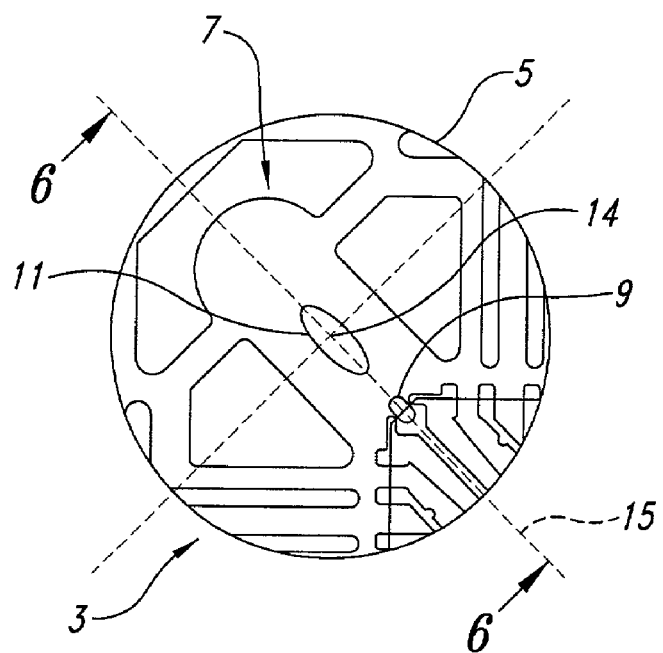
FIG. 5 shows a second embodiment of this invention.

In FIG. 5 a second embodiment of this invention is shown and according to what is illustrated in the figure it can be noted that in the zone 7 the applicant found it advantageous to make an ellipsoidal recess or through hole 11 on an outer surface of the lead-frame 1 with its center positioned on the axis of air vent 9 at a distance from the air vent 9 exceeding approximately 1 mm, so as to increase local adhesion of the flash to the surface of the lead-frame 1.

In this embodiment, the minor axis of ellipsoidal hole 11 is shorter than the diameter of hole 8 and the major axis exceeds the diameter of hole 8, that is the section of hole 11 is smaller than that of air vent 9.

Figure 6:
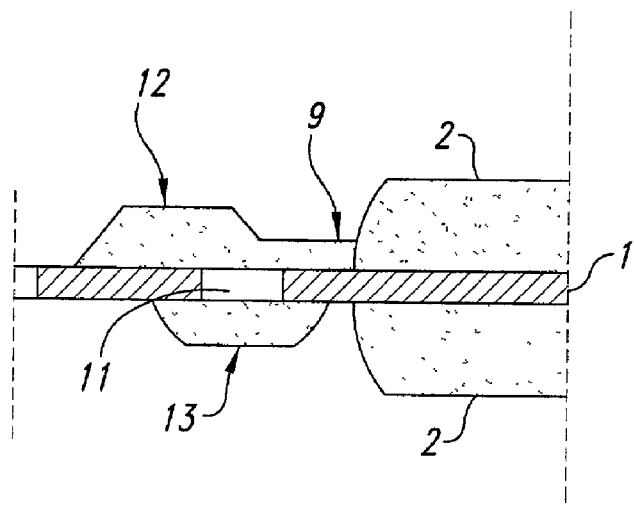
FIG. 6 shows a section of FIG. 5 along the line VI—VI.

In this way the resin flash which is created, as shown successively in FIG. 6, is thicker than that in the first embodiment because the resin flows in a greater quantity to fill the hole 11.

As shown in FIG. 6, which is the section of FIG. 5 along the line VI—VI, when the resin seeps from air vent 9, the thickness of the resin is equal to or exceeds 0.25 mm. Once the resin is solidified there is an upper flash 12 and a lower flash 13 with a thickness which is equal to or greater than 1 mm.

Also in this embodiment of this invention the object is to create a mechanical means for anchorage of the resin to the lead-frame 1, but given the fact that, as the hole 11 has larger dimensions than hole 8 and the quantity of flow of the resin is greater, there is also the formation of a button of resin 13, which can act as a welding means with lead-frame 1.

The flash, consisting of an upper portion 12 and a lower portion 13, is in cohesion with lead-frame 1 during the successive working phases, and in particular this embodiment can be implemented on those lines that make use of resin which has highly fragile flash, as in the case of transparent resin, which is the resin used in the molding of optic packages.

A solution such as this therefore guarantees high production yields.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A structure comprising:
   a frame; and
   a mold having at least one air vent from which the resin can seep out of during the injecting phase into said mold, said air vent being positioned between an upper and a lower surface of said frame, wherein said frame includes: a through hole placed adjacent to an outlet of said air vent so that when the resin has solidified it forms a flash which is in coherence with one of the upper and lower surfaces of said frame.

2. The structure according to claim 1 wherein said through hole has an ellipsoidal shape having a center positioned on an axis of said air vent and has a minor diameter dimension shorter than a diameter of said air vent.

3. The structure according to claim 2 wherein said air vent, in combination with said hole having an ellipsoidal section, gives rise to a flash of resin on the upper surface of said frame and to a flash of resin on the lower surface of said frame, with an overall combined thickness equal to or exceeding 1 mm.

4. The structure according to claim 2 wherein said hole with ellipsoidal section is positioned at a distance of more than 1 mm from said air vent.

5. The structure according to claim 1 wherein said through hole has a circular section with a center positioned on an axis of said air vent and has a dimension of its diameter equal to or shorter a diameter of said air vent.

6. The structure according to claim 5 wherein said air vent by means of said hole of circular section gives rise to a flash only on the upper surface of said frame, the flash having a thickness ranging between 20–25 μm.

7. The structure according to claim 5 wherein said hole of circular section is positioned at a distance of more than 1 mm from said air vent.

8. The structure of claim 1 wherein the mold includes an injection area at a first corner of the mold and the air vent is at a second corner of the mold, opposite to the first corner of the mold.

9. An integrated circuit package, comprising:
   a semiconductor device;
   a molded portion formed around the semiconductor device and having an injection area through which resin was injected to form the molded portion, a flashing portion of molded material extruded from a vent area of the molded portion, the vent area being spaced apart from the injection area; and
   a lead-frame external to the molded portion and having a hole adjacent to the vent area of the molded portion, the flashing portion at least partially filling the hole.

10. The integrated circuit package of claim 9 wherein the hole is formed on an axis passing through the flashing portion.

11. The integrated circuit package of claim 10 wherein the hole is a through-hole extending completely through the lead-frame.

12. The integrated circuit package of claim 11 wherein the flashing portion at least partially filling the hole includes a first portion formed on a first surface of the lead-frame and a second portion formed on a second surface of the lead-frame.

13. The integrated circuit package of claim 10 wherein the hole is a recess formed in the lead-frame.

14. The integrated circuit package of claim 10 wherein hole is substantially round in shape.

15. The integrated circuit package of claim 10 wherein the hole is substantially elliptical in shape.

16. The integrated circuit package of claim 15 wherein the hole is spaced a predetermined distance away from the extrusion of the flashing portion from the molded portion.

17. The integrated circuit package of claim 9 wherein the injection area is at a first corner of the molded portion and the vent area is at a second corner, opposite to the first corner of the molded portion.

18. A semiconductor lead-frame for an integrated circuit having a molded portion formed thereover, the molded portion having one or more flashing portions formed at peripheral extrusion areas thereof, the lead-frame comprising:

a conductive skeleton having a support surface and a plurality of conductive strips on the surface, the conductive strips defining an air vent zone of the surface that is structured for placement adjacent to one of the peripheral extrusion areas, the air vent zone including a hole in the surface for receiving a portion of one of the flashing portions.

19. The lead-frame of claim 18 wherein the hole is a recess formed in a surface of the conductive strip facing away from the molded portion.

20. The lead-frame of claim 18 wherein the hole is aligned with the flashing portion.

21. The lead-frame of claim 18 wherein the hole is a passage through the conductive strip.

22. The lead-frame of claim 21 wherein the hole is substantially circular in shape.

23. The lead-frame of claim 21 wherein the hole is substantially ellipsoidal in shape.

24. The lead-frame of claim 18 wherein the hole is spaced a predetermined distance away from an air vent of the air vent zone.

25. The lead-frame of claim 18, further comprising:

a semiconductor device mounted on the support surface of the conductive skeleton; wherein the molded portion is formed over the semiconductor device, the one or more flashing portions extending into the hole.

26. The lead-frame of claim 25 wherein the one or more flashing portions extend across a surface of the conductive strip facing away from the molded portion.

27. The lead-frame of claim 26 wherein:

the hole is a passage through the conductive strip; and the one or more flashing portions extend through the passage.

28. The lead-frame of claim 27 wherein the one or more flashing portions include a button portion on a surface of the conductive strip facing away from the molded portion.

* * * * *

UNITED STATES PATENT AND TRADEMARK OFFICE
CERTIFICATE OF CORRECTION

PATENT NO. : 7,075,172 B2 Page 1 of 1
APPLICATION NO. : 09/917406
DATED : July 11, 2006
INVENTOR(S) : Andrea Giovanni Cigada It is certified that error appears in the above-identified patent and that said Letters Patent is hereby corrected as shown below:

Title Page

Item (73), Assignees, the entry for the second named Assignee should read --STMicroelectronics Sdn., Bhd., Muar (MY)--.

Column 4
Line 28, "...shorter a diameter of said air vent." should read as --...shorter than a diameter of said air vent.--.

Signed and Sealed this

Thirteenth Day of November, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,075,172 B2 |
| APPLICATION NO. | : 09/917406 |
| DATED | : July 11, 2006 |
| INVENTOR(S) | : Andrea Giovanni Cigada |

It is certified that error appears in the above-identified patent and that said Letters Patent is hereby corrected as shown below:

Title Page

Item (73), Assignees, the entry for the second named Assignee should read --STMicroelectronics Sdn., Bhd., Muar (MY)--.

Column 4
Line 26, "...shorter a diameter of said air vent." should read as --...shorter than a diameter of said air vent.--.

Signed and Sealed this

Twenty-seventh Day of November, 2007

JON W. DUDAS
*Director of the United States Patent and Trademark Office*